United States Patent
Wolpert et al.

(10) Patent No.: US 11,213,926 B2
(45) Date of Patent: Jan. 4, 2022

(54) METHOD FOR POLISHING A WORKPIECE IN THE PRODUCTION OF AN OPTICAL ELEMENT

(71) Applicant: Carl Zeiss SMT GmbH, Oberkochen (DE)

(72) Inventors: Andreas Wolpert, Ellwangen (DE); Franz-Josef Stickel, Aalen-Unterrombach (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/997,274

(22) Filed: Aug. 19, 2020

(65) Prior Publication Data
US 2020/0376623 A1 Dec. 3, 2020

Related U.S. Application Data (63) Continuation of application No. PCT/EP2019/052178, filed on Jan. 30, 2019.

(30) Foreign Application Priority Data

Feb. 20, 2018 (DE) .................... 10 2018 202 570.3

(51) Int. Cl.
- *B24B 9/14* (2006.01)
- *B24B 29/00* (2006.01)
- *G03F 7/20* (2006.01)

(52) U.S. Cl.
CPC ............... *B24B 9/14* (2013.01); *B24B 29/00* (2013.01); *G03F 7/7015* (2013.01); *G03F 7/70608* (2013.01)

(58) Field of Classification Search
CPC .......... B24B 13/00; B24B 29/00; B24B 9/14; G03F 7/7015; G03F 7/70608; G02B 6/3863
See application file for complete search history.

(56) References Cited

U.S. PATENT DOCUMENTS

2005/0250426 A1* 11/2005 Ferme .................. B24B 37/042
451/63
2019/0126425 A1 5/2019 Schneider et al.

FOREIGN PATENT DOCUMENTS

DE 203853 B1 10/1986
DE 102004047563 A1 4/2006
(Continued)

OTHER PUBLICATIONS

PCT International Preliminary Report on Patentability, PCT/EP2019/052178, dated Aug. 27, 2020, 7 pages.
(Continued)

*Primary Examiner* — Peter B Kim
(74) *Attorney, Agent, or Firm* — Edell, Shapiro & Finnan LLC (57) ABSTRACT

A method for polishing a workpiece in the production of an optical element, in particular for microlithography, wherein a relative movement takes place between a polishing tool (300) and a workpiece surface (110, 120, 210) being machined. A polishing tool surface (215, 315) of the polishing tool (300) is formed by a viscoelastic polishing medium (303), wherein the polishing tool surface has an average diameter which is less than 50% of the average diameter of the workpiece surface being machined. The polishing tool surface during polishing is guided by an overrun distance beyond at least one edge (110a, 110b, 120a, 120b, 210a, 210b) delimiting the workpiece surface being machined, wherein the average diameter of the polishing tool surface is at least twice the overrun distance.

16 Claims, 5 Drawing Sheets

(56) References Cited

FOREIGN PATENT DOCUMENTS

| | | |
|---|---|---|
| DE | 102007050470 A1 | 9/2008 |
| DE | 102011084118 A1 | 4/2013 |
| DE | 102014114172 A1 | 3/2016 |
| DE | 102015208820 A1 | 11/2016 |
| DE | 102016217737 A1 | 11/2016 |
| DE | 102017202649 A1 | 4/2017 |
| DE | 102015223983 A1 | 6/2017 |
| DE | 102017216129 A1 | 11/2017 |
| DE | 102016006741 A1 | 12/2017 |
| WO | 2007014732 A2 | 2/2007 |
| WO | 2017093020 A1 | 6/2017 |

OTHER PUBLICATIONS

German Office Action with English translation, Application No. 102018202570.3, dated Jan. 11, 2019, 8 pages.
International Search Report, PCT/EP2019/052178, dated Mar. 21, 2019, 6 pages.

\* cited by examiner

METHOD FOR POLISHING A WORKPIECE IN THE PRODUCTION OF AN OPTICAL ELEMENT

CROSS REFERENCE TO RELATED APPLICATIONS

This is a Continuation of International Application PCT/EP2019/052178, which has an international filing date of Jan. 30, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 202 570.3 filed on Feb. 20, 2018.

FIELD OF THE INVENTION

The invention relates to a method for polishing a workpiece in the production of an optical element, in particular for microlithography.

BACKGROUND

Microlithography is used for producing microstructured components, such as for example integrated circuits or liquid crystal displays (LCDs). The microlithography process is conducted in what is called a projection exposure apparatus, which comprises an illumination device and a projection lens. The image of a mask (=reticle) illuminated with the illumination device is thereby projected with the projection lens onto a substrate (e.g., a silicon wafer) coated with a light-sensitive layer (photoresist) and arranged in the image plane of the projection lens, in order to transfer the mask structure to the light-sensitive coating of the substrate.

Further optical systems used in microlithography also comprise inspection systems e.g. in the form of a mask inspection system for inspecting reticles, or masks, for use in a projection exposure apparatus or of a wafer inspection system for observing and testing wafer surfaces.

In optical systems designed for the extreme ultraviolet (EUV) range, i.e., at wavelengths of, e.g., approximately 13 nm or approximately 7 nm, mirrors are used as optical components for the imaging process owing to the lack of availability of suitable light-transmissive refractive materials.

In view of the transmission losses that occur on account of the limited reflectivities of the individual mirror surfaces in such systems, it is desirable in principle to minimize the number of mirrors used in the respective optical system. Furthermore, increases in resolution are achieved through, inter alia, increases in the numerical aperture, with a concomitant enlargement of the mirror surfaces. In practice, this leads to demanding challenges, among other things with regard to the arrangement of the mirrors in the available installation space of the optical system.

In order to produce the mirrors with the respectively desired final specification, a plurality of machining processes, in particular polishing processes, must be carried out. As a rule, the polishing tool has to be moved temporarily beyond an edge delimiting the workpiece surface to be machined for manufacturing reasons. In practice, this leads to demanding challenges in scenarios in which (in what are known as "edge-sharp designs") the respective optical used region must be guided to the edge of the respective optical element up to distances of a few millimeters or even below one millimeter.

One available approach involves temporarily adding overrun sections for the purpose that the respective polishing tool can extend beyond the edge delimiting the optical surface during polishing. However, such overrun sections or attachment pieces lead to the problem that a gap between the overrun section or attachment piece on the one hand and the optical surface on the other hand is present. This ultimately results, after polishing, in registration errors (i.e., deviations from a specified desired shape of the optical effective surface of the optical element in question). However, the spatial extent of said registration errors on the scale of typically an order of magnitude of (5-10) millimeters is no longer tolerable in the abovementioned scenarios, which require edge-sharp designs. Thus, generation of such gaps should be avoided.

The problem described above proves to be serious in particular in optical systems (including the mask inspection systems mentioned in the introductory part), which contain what are known as Schwarzschild designs for realizing a particularly compact construction, wherein, among other things, obscured mirrors with at least one perforation that allows light to pass through and comparatively small mirror diameters are used.

Regarding the prior art, reference is made merely by way of example to DE 10 2015 208 820 A1 and DE 10 2011 084 118 A1.

SUMMARY

Against the above background, it is an object of the present invention to provide a method for polishing a workpiece in the production of an optical element, which permits registration errors to be minimized while avoiding the above-described problems even in scenarios in which the optical used region must be guided very close to the edge of the workpiece surface.

This object is achieved by way of methods according to the features of the independent patent claims set forth herein.

According to one formulation, the invention relates to a method for polishing a workpiece during the production of an optical element, in particular for microlithography, wherein a relative movement takes place between a polishing tool and a workpiece surface to be machined, wherein a polishing tool surface of the polishing tool is formed by a viscoelastic polishing medium;

wherein said polishing tool surface has an average diameter which is less than 50% of the average diameter of the workpiece surface to be machined;

wherein the polishing tool surface is guided during polishing by an overrun distance beyond at least one edge delimiting the workpiece surface to be machined; and wherein the average diameter of the polishing tool surface is at least twice the overrun distance.

Within the meaning of the present application, the "overrun distance" is to be understood to be the maximum projection of the edge of the polishing tool beyond the workpiece edge during the polishing process (whereby this workpiece edge can be present on the workpiece outwardly or inwardly or toward a central perforation).

The invention is based in particular on the concept of dispensing with the temporary use of the attachment pieces or overrun sections described in the introductory part and thus avoiding the introduction of a gap to reduce or minimize the occurrence of registration errors when the polishing tool is guided beyond an edge delimiting the workpiece surface to be machined by using a polishing tool with sufficient rigidity and size.

The high rigidity or hardness of the viscoelastic polishing medium according to the invention here has, in comparison to conventional polishing cloths, the advantageous effect that a mechanical reaction by the polishing tool to the moving beyond the relevant edge region of the workpiece surface to be machined and the associated polishing defects, such as those occurring for example in the case of the temporary deformation of a polishing cloth at an edge region of the workpiece surface, which returns to its original shape only after a finite time period, can be avoided or minimized.

The sufficiently large design of the polishing tool surface relative to the respective overrun distance means that the effect of a surface pressure variation that is associated with moving the polishing tool surface beyond the edge delimiting the workpiece surface to be machined and that is in turn associated with a variation in material removal produced during the polishing is kept comparatively small so that any occurrence of polishing or registration errors is minimized to that extent.

The feature according to which the average diameter of the polishing tool surface (i.e., the surface of the polishing tool which is effective in principle during polishing) is less than 50% of the average diameter of the workpiece surface to be machined is intended to express that, according to the invention, what is known as "zonal polishing" (in contrast to a full-surface polish) is performed. Without the invention being restricted to this, this can be, in particular, (post-) polishing of the surrounding region of a perforation that is provided in the workpiece to enable light to pass through the optical element or which was previously produced by material-removing machining. In further applications, said zonal polishing can alternatively or additionally also be carried out in the radially outer edge region of the workpiece.

According to one embodiment, the average diameter of the polishing tool surface is at least three times the overrun distance, in particular at least four times the overrun distance.

In the abovementioned application of the method according to the invention to a workpiece provided with a perforation (typically provided for an obscured mirror), the polishing surface preferably has an average diameter which is at least twice the average diameter of the perforation. The design of the polishing tool surface to this extent is comparatively large leads here to the effect already described above that, when the perforation is traversed, the increase in the surface pressure, associated with the reduction in the contact area between the workpiece surface to be machined and the polishing tool surface, is small relative to the overall size of the polishing tool surface and any associated variations in the material removal and the resulting long-wave polishing or registration errors can be kept small. Remaining polishing or registration errors are able to be easily corrected by subsequent machining.

Pitch is preferably used as the viscoelastic polishing medium. The generic term "pitch" is intended to encompass here both natural pitches (in particular those produced by thermal decomposition of organic products and during the production of tar) and synthetic pitches and also comparable bituminous materials. The use of such pitch media has the advantage, among other things, that in addition to good formability in the polishing tool brought about after heating, there is still a certain residual adaptability even when using the polishing tool in the respective operating temperature range, and short-range hardness (existing over distances of less than 10 mm to 20 mm) is combined with a long-range adaptability (existing over distances of more than 20 mm).

In embodiments of the invention, the optical element is a mirror, in particular an aspherical mirror. The avoidance of registration errors according to the invention is particularly advantageous in such applications, which generally require zonal polishing using subaperture tools.

The invention furthermore relates to the use of a polishing tool for zonal polishing in the production of an aspherical mirror, in particular in a method with the features described above, wherein the polishing tool has a viscoelastic polishing medium, wherein this viscoelastic polishing medium includes pitch.

The invention furthermore relates to an optical element, in particular for microlithography, which is produced using a method with the features described above, to an optical system of a microlithographic projection exposure apparatus, in particular an illumination device or a projection objective, and to a microlithographic projection exposure apparatus.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIGS. 2-3 show schematic representations to illustrate a polishing process according to the invention or the possible structure of a polishing tool used during that process, where

DETAILED DESCRIPTION

In the production of an optical element in the form of a mirror or a lens element, typically a layer or a layer system (which, for example in the case of a mirror, can have a reflection layer system composed of molybdenum and silicon layers) is applied onto a substrate. A plurality of machining processes, in particular polishing processes, need to be performed to produce the optical element. Not only the substrate but also the layer itself can be machined in this way. The substrate can be produced e.g. from silicon (Si) or quartz glass doped with titanium dioxide ($TiO_2$), wherein the materials that are sold under the trade names ULE® (by Corning Inc.) or Zerodur (by Schott AG) are able to be used by way of example. In further embodiments, the substrate can also be made from aluminum (Al), silicon carbide (SiC) or another ceramic material.

Figure 1:
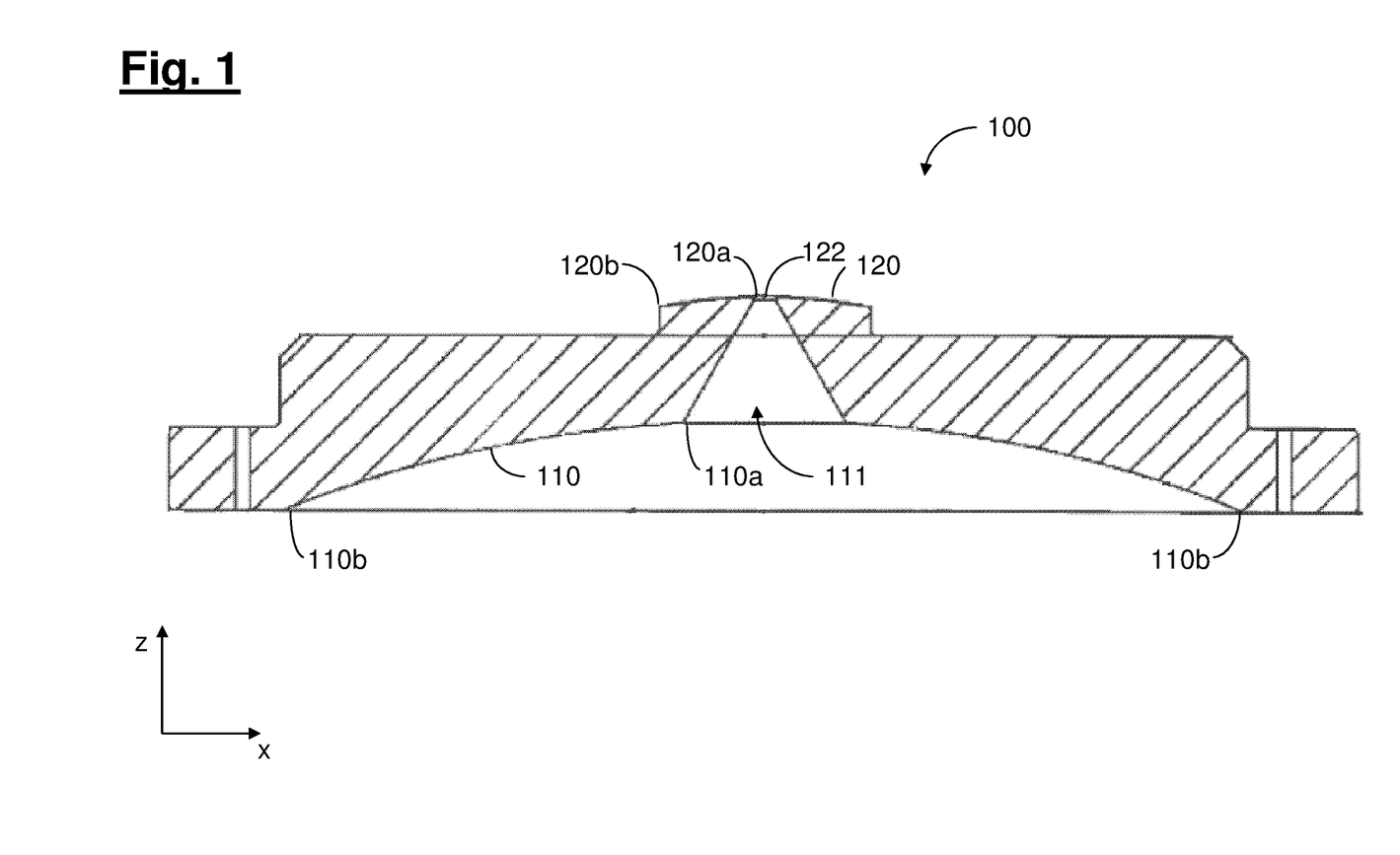
FIG. 1 shows a schematic illustration of an example of a mirror manufactured using the method according to the invention.

FIG. 1 shows, in a merely schematic illustration, a mirror 100 manufactured using the method according to the invention. The mirror 100 is—without the invention being restricted to such applications—a double mirror with a first (in the exemplary embodiment concave) optically effective surface or workpiece surface 110 and a second (in the exemplary embodiment convex) optically effective surface or workpiece surface 120. Furthermore, the mirror 100 has a perforation 111 to enable light to pass through, likewise without the invention being restricted to this. The respective edges that delimit the first workpiece surface 110 radially inwardly or radially outwardly, are denoted with "110a" or "110b."

The production process of the mirror 100 preferably proceeds in such a way that the perforation 111 is initially not yet produced through the entire thickness of the mirror 100, but rather such that, firstly, registration damage due to the required material removal on the part of the second workpiece surface 120 is avoided as much as possible by way of a membrane 122, indicated in FIG. 1, being left behind. The membrane 122 is preferably removed to produce the complete perforation only toward the end of the manufacturing process or after the required material removal, including the necessary polishing or finishing operations, has been completed on the part of the first workpiece surface 110.

The use of the double mirror described above with reference to FIG. 1 has the advantage, for example, in the Schwarzschild designs mentioned in the introductory part that the considerable adjustment effort that is associated with an (alternatively also feasible) configuration with two separate individual mirrors can be avoided.

However, the invention can also be advantageously implemented in the production of mirrors with only a single optical effective surface. Furthermore, the invention can be advantageously implemented both in the case of mirrors with at least one perforation that enables light to pass through and in the case of mirrors without a perforation. In the latter case, the limitation according to the invention of the registration damage caused by the polishing process during the zonal polishing of the radially outer edge region advantageously comes into play, with the result that the optical used region can be brought up to the outer edge up to small distances of less than 1 mm, and correspondingly edge-sharp designs or compact optical systems can be realized.

The polishing process according to the invention or a polishing tool used here will be explained below with reference to the schematic illustrations in FIG. 2 and FIG. 3.

Figure 3:
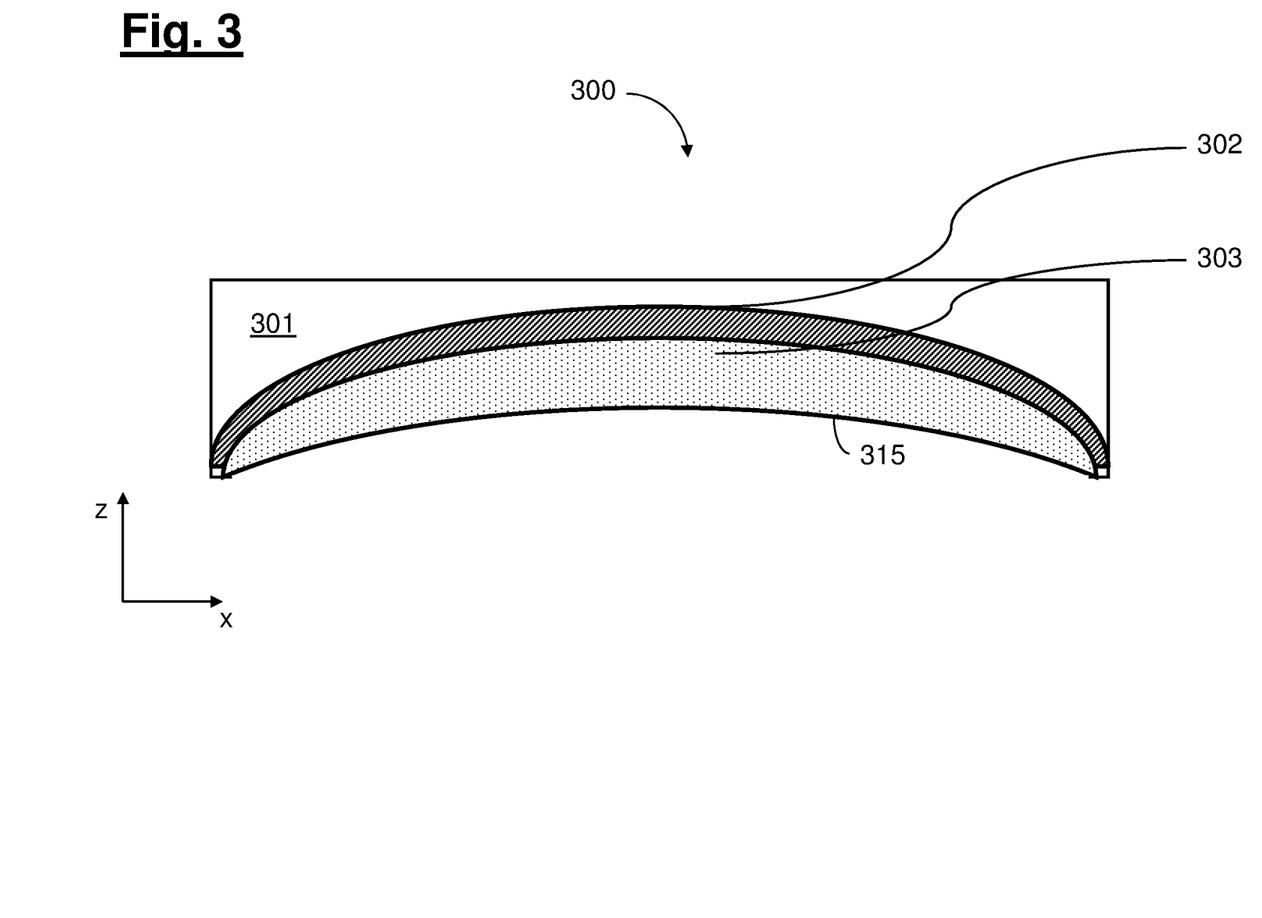

According to FIG. 3, a polishing tool 300 used in the method according to the invention has a viscoelastic polishing medium 303 that includes pitch and is applied onto a base body 302, which forms a flexible base and is made of elastically deformable material (for example a polymer-based foam). "301" denotes a shell-like carrier structure.

Figure 2:
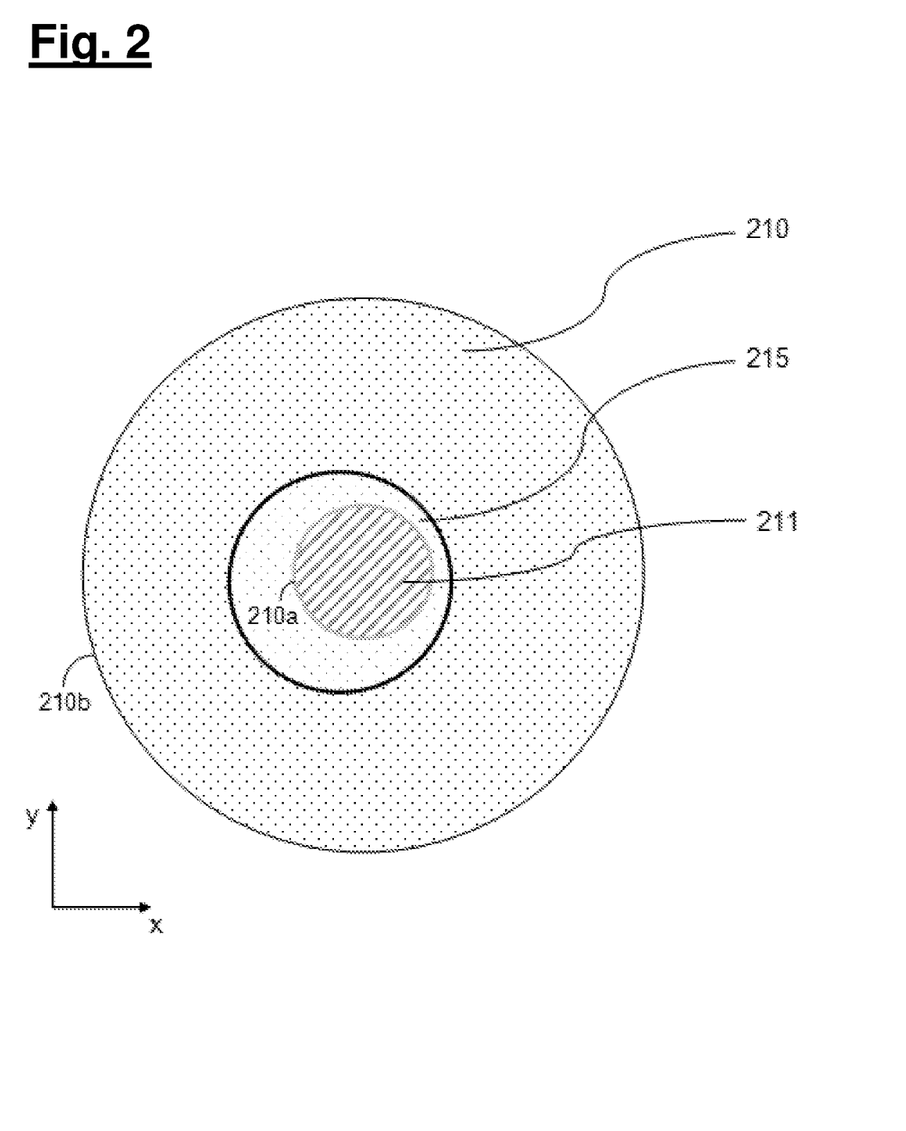
FIG. 2 shows relevant components and FIG. 3 shows an exemplary polishing tool.

FIG. 2 serves as a merely schematic illustration to explain suitable proportions of the components relevant in the method according to the invention. The workpiece surface to be machined is denoted with "210" in FIG. 2, and a perforation provided in the workpiece to enable light to pass through the optical element to be manufactured is denoted with "211." "210a" denotes the edge which delimits the workpiece surface 210 radially inwardly (i.e., toward the perforation 211), and "210b" denotes the edge which delimits the workpiece surface 210 to be machined radially outwardly. The polishing tool surface (i.e., the surface of the polishing tool that can be used in principle for polishing) is denoted with "215" in FIG. 2 and with "315" in FIG. 3.

As indicated in FIG. 2, this polishing tool surface 215 is substantially smaller than the workpiece surface 210 to be machined to enable zonal polishing, wherein the average diameter of the polishing tool surface 215 is less than 50% of the average diameter of the workpiece surface 210 to be machined.

Furthermore, however, as explained in the introductory part, the polishing tool surface 215 is sufficiently large to minimize surface pressure variations and the associated variations in material removal and ultimately resulting polishing or registration errors, wherein the average diameter of the polishing tool surface is at least twice the overrun distance by which the polishing tool surface 215 is guided beyond the relevant edge delimiting the workpiece surface 210 to be machined. In particular, the average diameter of the polishing tool surface 215 can be at least twice the average diameter of the perforation 211.

Figure 4:
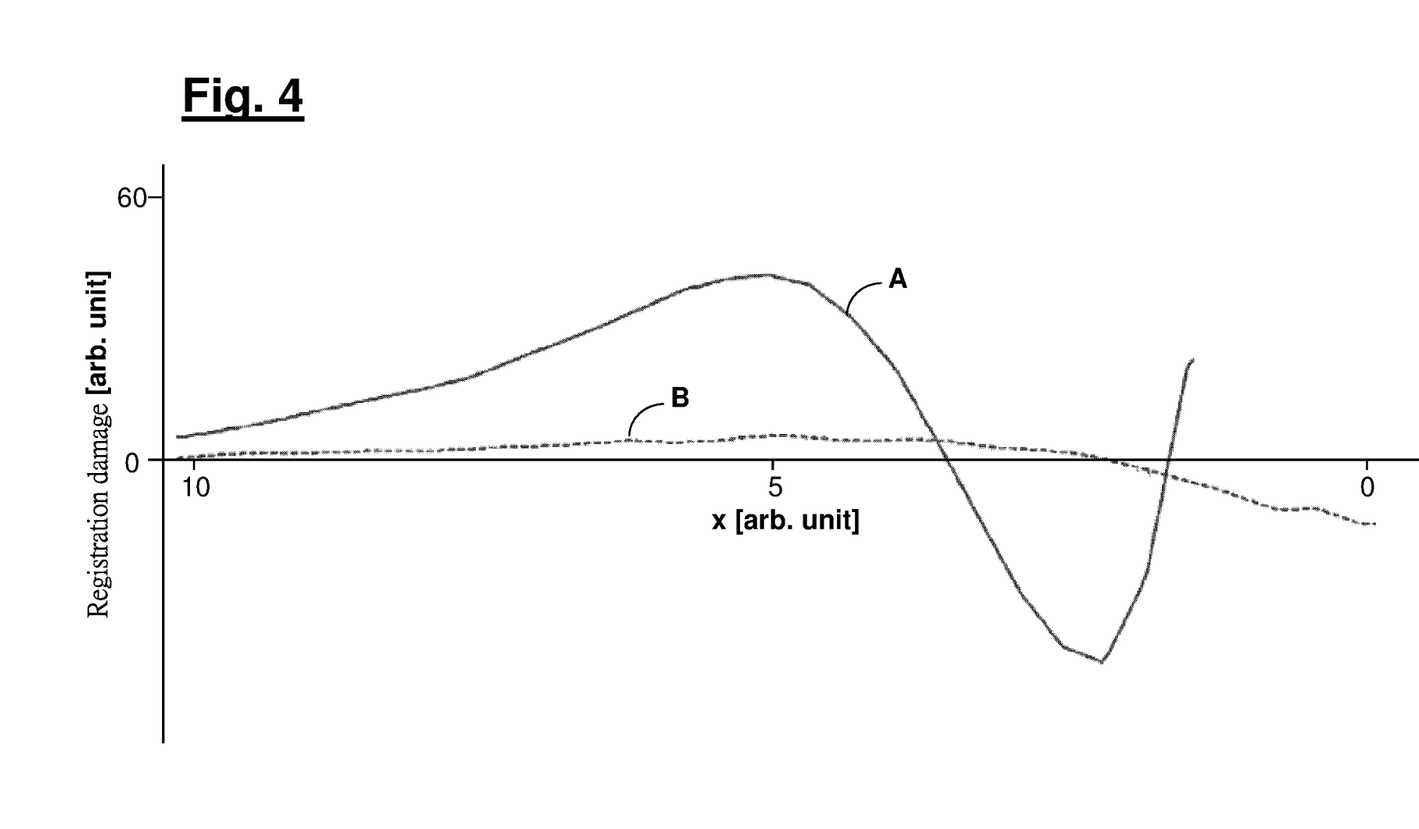
FIG. 4 shows a diagram for illustrating a reduction in registration damage that is able to be achieved with the method according to the invention.

FIG. 4 shows a diagram for illustrating the reduction in registration damage during polishing that is achievable with the method according to the invention. In FIG. 4, curve "A" corresponds to the use of a zonal polishing tool with a polishing removal of 300 nm, while curve "B" corresponds to the use of a polishing tool according to the invention with a removal of 500 nm. On the horizontal axis, the value zero corresponds to the position of the edge adjoining a perforation in the workpiece or mirror. As can be seen from FIG. 4, the method according to the invention enables a significant reduction in registration damage as a result of the polishing process, in particular in said edge region.

Figure 5:
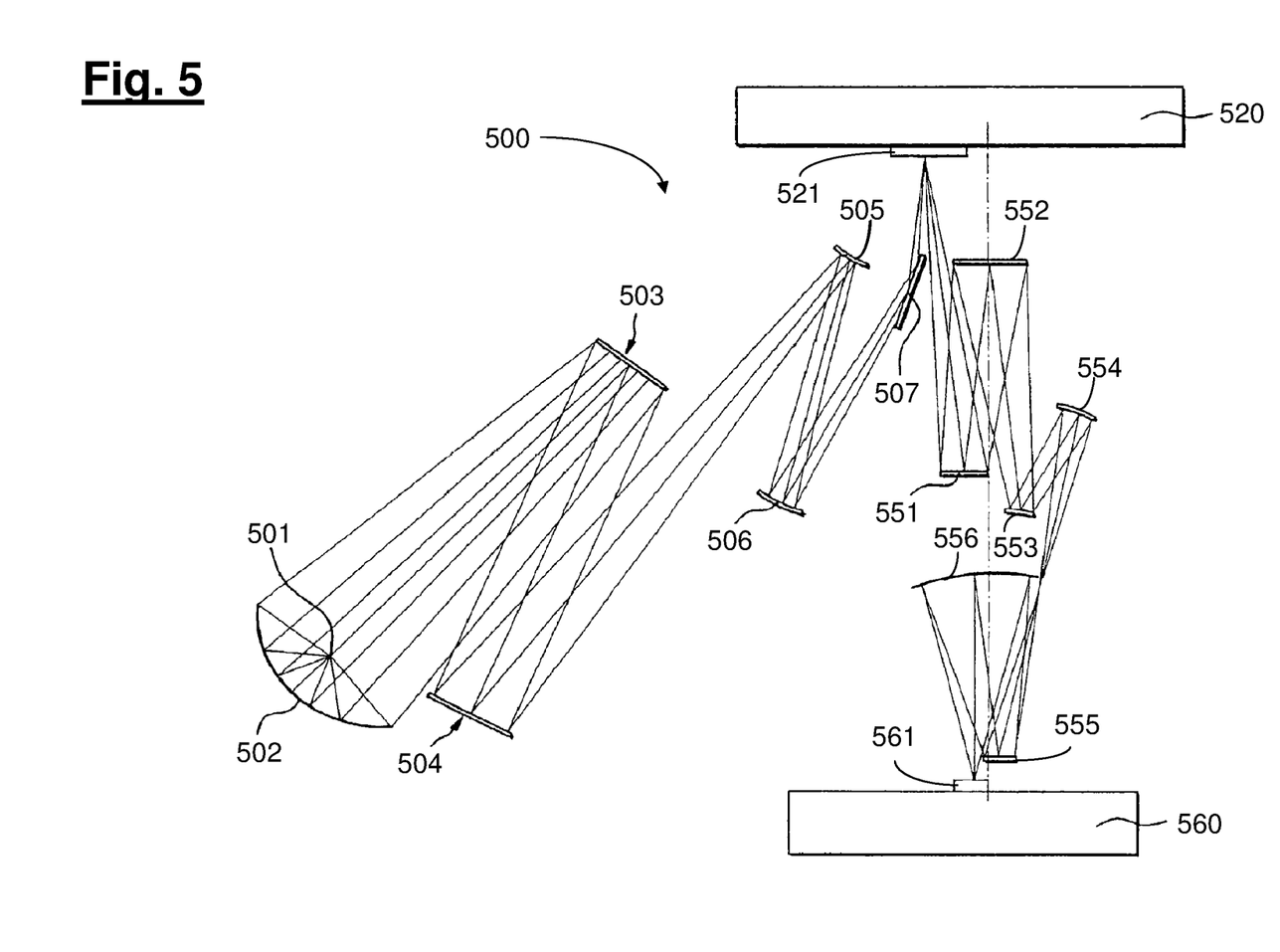
FIG. 5 shows a schematic illustration for explaining the possible construction of a microlithographic projection exposure apparatus designed for operation in EUV.

FIG. 5 shows a schematic illustration of a projection exposure apparatus that is given by way of example and is designed for operation in the EUV range.

According to FIG. 5, an illumination device in a projection exposure apparatus 500 designed for EUV comprises a field facet mirror 503 and a pupil facet mirror 504. The light from a light source unit comprising a plasma light source 501 and a collector mirror 502 is directed onto the field facet mirror 503. A first telescope mirror 505 and a second telescope mirror 506 are arranged in the light path downstream of the pupil facet mirror 504. A deflection mirror 507 is arranged downstream in the light path, said deflection mirror directing the radiation that is incident thereon onto an object field in the object plane of a projection lens comprising six mirrors 551-556. At the location of the object field, a reflective structure-bearing mask 521 is arranged on a mask stage 520, said mask being imaged with the aid of the projection lens into an image plane in which a substrate 561 coated with a light-sensitive layer (photoresist) is situated on a wafer stage 560. The invention is able to be used in the production of any optical element of the projection exposure apparatus. In particular, the invention is able to be used advantageously if at least one of the optical elements or mirrors has, for example in the projection lens, a perforation or a hole to enable light to pass through.

Furthermore, the invention is also able to be advantageously implemented when implementing further (in particular especially compact) optical systems, such as, for example, mask inspection systems or wafer inspection systems. With regard to specific design examples, in which at least one mirror has a perforation or a hole to enable light to pass through, reference is made to DE 10 2016 217 737 A1 merely by way of example.

However, the invention is not restricted to the realization in the production of optical elements for operation in the EUV, but rather is also realizable in the production of optical elements for other operating wavelengths (e.g. in the VUV range or at wavelengths of less than 250 nm).

Even though the invention has been described on the basis of specific embodiments, numerous variations and alternative embodiments will be apparent to the person skilled in the art, for example through combination and/or exchange of features of individual embodiments. Accordingly, such variations and alternative embodiments are also encompassed by the present invention, and the scope of the invention is restricted only within the meaning of the appended patent claims and equivalents thereof

What is claimed is:

1. A method for polishing a workpiece during production of an optical element, comprising:
   forming a polishing tool surface with a viscoelastic polishing medium on a polishing tool,
   producing a relative movement between the polishing tool surface of the polishing tool and a workpiece surface being machined,
      wherein the polishing tool surface has an average diameter which is less than 50% of an average diameter of the workpiece surface being machined; and
   guiding the polishing tool surface by an overrun distance beyond at least one edge delimiting the workpiece surface being machined,
      wherein the average diameter of the polishing tool surface is at least twice the overrun distance;
      wherein the workpiece has at least one perforation configured to enable light to pass through the optical element; and
      wherein the at least one edge delimiting the workpiece surface being machined is a radially inner edge of the workpiece.

2. The method as claimed in claim 1, wherein the average diameter of the polishing tool surface is at least three times the overrun distance.

3. The method as claimed in claim 1, wherein the perforation has an average diameter, and wherein the average diameter of the polishing tool surface is at least twice an average diameter of the perforation.

4. The method as claimed in claim 1, wherein at least one further edge delimiting the workpiece surface being machined is a radially outer edge of the workpiece.

5. The method as claimed in claim 1, wherein the viscoelastic polishing medium includes pitch.

6. The method as claimed in claim 1, wherein the optical element is a mirror.

7. The method as claimed in claim 6, wherein the mirror is an aspherical mirror.

8. The method as claimed in claim 1, wherein the optical element is configured for an operating wavelength of less than 30 nm.

9. The method as claimed in claim 1, wherein said guiding of the polishing tool surface comprises zonal polishing in production of an aspherical mirror, and wherein the viscoelastic polishing medium includes pitch.

10. An optical element, produced with the method as claimed in claim 1, wherein an extent of registration errors on the optical element is on an order of magnitude of less than 5 millimeters.

11. An optical system of a microlithographic projection exposure apparatus, comprising an optical element as claimed in claim 10.

12. The optical system as claimed in claim 11, wherein a distance between the edge delimiting the workpiece surface and an optical used region of the workpiece surface is less than 3 mm.

13. The optical system as claimed in claim 12, wherein the distance between the edge delimiting the workpiece surface and the optical used region of the workpiece surface is less than 1 mm.

14. The optical system of the microlithographic projection exposure apparatus as claimed in claim 11, further comprising a mask inspection system or a wafer inspection system.

15. A microlithographic projection exposure apparatus comprising an illumination device and a projection lens, wherein the projection exposure apparatus comprises an optical element as claimed in claim 10.

16. A method for polishing a workpiece during production of an optical element, comprising:
   forming a polishing tool surface with a viscoelastic polishing medium on a polishing tool,
   producing a relative movement between the polishing tool surface of the polishing tool and a workpiece surface being machined,
      wherein the polishing tool surface has an average diameter which is less than 50% of an average diameter of the workpiece surface being machined; and
   guiding the polishing tool surface by an overrun distance beyond at least one edge delimiting the workpiece surface being machined,
      wherein the workpiece has at least one perforation configured to enable light to pass through the optical element;
      wherein the at least one edge delimiting the workpiece surface being machined is a radially inner edge of the workpiece;
      wherein the average diameter of the polishing tool surface is at least three times the overrun distance; and
      wherein the perforation has an average diameter, and wherein the average diameter of the polishing tool surface is at least twice an average diameter of the perforation.

* * * * *

UNITED STATES PATENT AND TRADEMARK OFFICE
CERTIFICATE OF CORRECTION

| | | |
|---|---|---|
| PATENT NO. | : 11,213,926 B2 | Page 1 of 1 |
| APPLICATION NO. | : 16/997274 | |
| DATED | : January 4, 2022 | |
| INVENTOR(S) | : Wolpert et al. | |

It is certified that error appears in the above-identified patent and that said Letters Patent is hereby corrected as shown below:

On the Title Page

Column 2, Line 1, item (56) delete "Reporton" and insert -- Report on --.

In the Specification

Column 7, Line 3, delete "thereof" and insert -- thereof. --.

Signed and Sealed this
Twenty-eighth Day of March, 2023

Katherine Kelly Vidal
*Director of the United States Patent and Trademark Office*